(12) United States Patent
Rogenmoser et al.

(10) Patent No.: US 6,995,600 B2
(45) Date of Patent: Feb. 7, 2006

(54) FAST AND WIRE MULTIPLEXING CIRCUITS

(75) Inventors: Robert Rogenmoser, Santa Clara, CA (US); Lief O'Donnell, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 290 days.

(21) Appl. No.: 09/901,740

(22) Filed: Jul. 9, 2001

(65) Prior Publication Data

US 2003/0006821 A1 Jan. 9, 2003

(51) Int. Cl.
*H03K 17/65* (2006.01)

(52) U.S. Cl. ................... 327/410; 327/409; 326/105; 326/108

(58) Field of Classification Search ................ 327/407, 327/408, 409, 410, 411, 412, 413; 326/105, 326/106, 107, 108
See application file for complete search history.

(56) References Cited

U.S. PATENT DOCUMENTS

| | | | | |
|---|---|---|---|---|
| 3,654,394 A | * | 4/1972 | Gordon | ...................... 370/534 |
| 5,243,599 A | * | 9/1993 | Barrett et al. | ................ 370/541 |
| 5,646,558 A | | 7/1997 | Jamshidi | .................... 327/408 |
| 5,789,966 A | | 8/1998 | Bechade | .................... 327/407 |
| 5,920,202 A | * | 7/1999 | Young et al. | ................. 326/39 |
| 6,066,978 A | | 5/2000 | Kadowaki | ................... 327/407 |
| 6,081,135 A | * | 6/2000 | Goodnow et al. | ............ 326/93 |
| 6,118,300 A | * | 9/2000 | Wittig et al. | .................. 326/41 |
| 6,388,466 B1 | * | 5/2002 | Wittig et al. | .................. 326/40 |
| 6,556,042 B1 | * | 4/2003 | Kaviani | ....................... 326/39 |

OTHER PUBLICATIONS

SiByte, "Target Applications," http://sibyte.com/mercurian/applications.htm, Jan. 15, 2001, 2 pages.
SiByte, "SiByte Technology," http://sibyte.com/mercurian/technology.htm, Jan. 15, 2001, 3 pages.
SiByte, "The Mercurian Processor," http://sibyte.com/mercurian, Jan. 15, 2001, 2 pages.
SiByte, "Fact Sheet," SB–1 CPU, Oct. 2000, rev. 0.1, 1 page.
SiByte, "Fact Sheet," SB–1250, Oct. 2000, rev. 0.2, 10 pages.
Stepanian, SiByte, SiByte SB–1 MIPS64 CPU Core, Embedded Processor Forum 2000, Jun. 13, 2000, 15 pages.
Jim Keller, "The Mercurian Processor: A High Performance, Power–Efficient CMP for Networking," Oct. 10, 2000, 22 pages.
Weste, et al., "Principles of CMOS VLSI Deisgn," A Systems Perspective, Addison–Wesley Publishing Company, Jun. 1988, 5 pages.
Tom R. Halfhill, "SiByte Reveals 64–Bit Core For NPUs; Independent MIPS64 Design Combines Low Power, High Performance," Microdesign Resources, Jun. 2000, Microprocessor Report, 4 pages.
International Search Report for EP Application No. 02 015 278.1, mailed Oct. 28, 2002.

\* cited by examiner

*Primary Examiner*—Terry D. Cunningham
(74) *Attorney, Agent, or Firm*—Garlick Harrison & Markison LLP

(57) ABSTRACT

An apparatus for a multiplexor circuit includes a passgate circuit coupled to receive input signals and corresponding select signals comprising a subset of the input signals and select signals received by the multiplexor. The apparatus also includes a default circuit coupled to receive the select signals and coupled to an output node of the passgate circuit. If none of the select signals is asserted, the default circuit supplies a default voltage on the output node. Other passgate circuits and default circuits may be included coupled to other subsets of the input signals and select signals, and an output circuit may be included with inputs coupled to the output nodes of the passgate circuits. The default voltage may represent a logical value which allows the value from another passgate circuit to control the output of the output circuit.

2 Claims, 5 Drawing Sheets

FAST AND WIRE MULTIPLEXING CIRCUITS

BACKGROUND OF THE INVENTION

1. Field of the Invention

This invention is related to the field of multiplexor circuits.

2. Description of the Related Art

Multiplexors are a basic building block of digital circuits. Generally, a multiplexor (mux) is a circuit used to select one of two or more inputs as an output responsive to selection control signals provided to the mux. Because they are frequently used, it is desirable for muxes to be high speed (have a low delay).

Unfortunately, wide muxes (e.g. greater than five inputs) are difficult to design with low delay. If a single level mux is designed, internal electrical loading (or the buffering used to alleviate the loading) generally increases the delay of the mux to approximately the same delay as two levels of smaller muxes (e.g. an 8 to 1 one mux can be accomplished with two 4 to 1 muxes, each receiving separate sets of 4 inputs, followed by a 2 to 1 mux coupled to receive the outputs of the 4 to 1 muxes). Thus, wide muxes are generally not designed, opting instead for the two level approach.

SUMMARY OF THE INVENTION

An apparatus for a multiplexor circuit includes a passgate circuit coupled to receive input signals and corresponding select signals comprising a subset of the input signals and select signals received by the multiplexor. The apparatus also includes a default circuit coupled to receive the select signals and coupled to an output node of the passgate circuit. If none of the select signals is asserted, the default circuit supplies a default voltage on the output node. Other passgate circuits and default circuits may be included coupled to other subsets of the input signals and select signals, and an output circuit may be included with inputs coupled to the output nodes of the passgate circuits. The default voltage may represent a logical value which allows the value from another passgate circuit to control the output of the output circuit.

A wide multiplexor having low delay may be constructed from the passgate circuits, default circuits, and output circuits. The diffusion capacitance on the output node of a passgate circuit may be less than would be experienced if passgates corresponding to all inputs were coupled to a common node. The multiplexor may have lower delay than a two level multiplexing circuit having the same number of inputs.

Broadly speaking, an apparatus is contemplated, comprising a first passgate circuit and a first circuit. The first passgate circuit is coupled to receive a first plurality of input signals and a first plurality of select signals, and includes a first output node. The first passgate circuit is configured to output a first voltage on the first output node responsive to an assertion of a first select signal of the first plurality of select signals. The first voltage is indicative of a corresponding one of the first plurality of input signals. Coupled to receive the first plurality of select signals and coupled to the first output node, the first circuit is configured to output a second voltage on the first output node responsive to each of the first plurality of select signals being deasserted.

Additionally, an apparatus is contemplated, comprising first and second pluralities of passgates, and a first, second, and third circuit. Each of the first plurality of passgates is coupled to receive a respective first input signal and a respective first select signal. The plurality of passgates are also coupled to a first output node. Coupled to receive the first select signals and coupled to the first output node, the first circuit is configured to output a first voltage on the first output node responsive to each of the first select signals being deasserted. Similarly, each of the second plurality of passgates is coupled to receive a respective second input signal and a respective second select signal, and the plurality of passgates are coupled to a second output node. The second circuit is coupled to receive the second select signals and coupled to the second output node, and is configured to output a second voltage on the second output node responsive to each of the second select signals being deasserted. The third circuit has a first input coupled to the first output node and a second input coupled to the second output node, and is configured to provide an output responsive to the first input and the second input.

BRIEF DESCRIPTION OF THE DRAWINGS

The following detailed description makes reference to the accompanying drawings, which are now briefly described.

Figure 1:
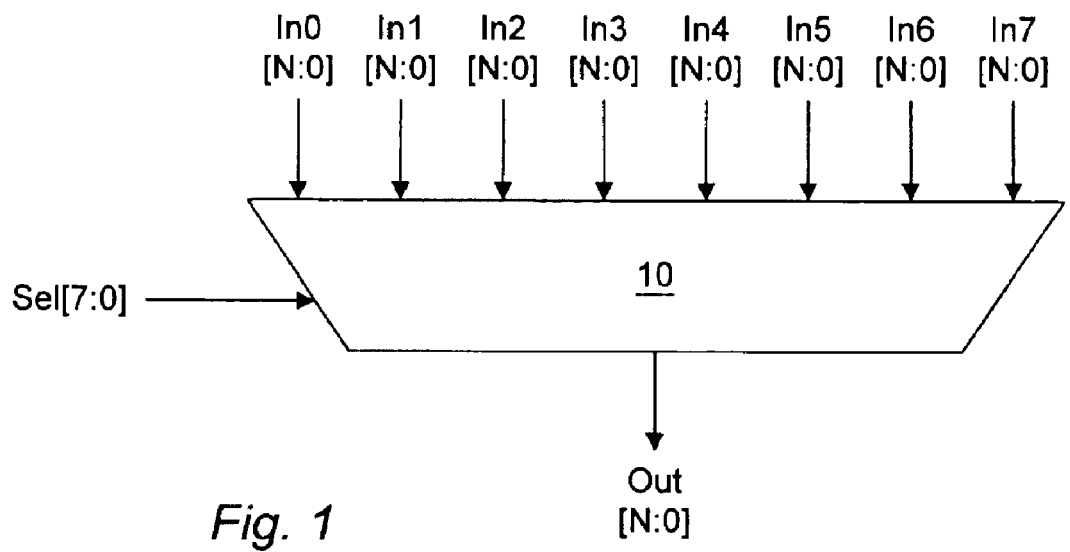
FIG. 1 is a block diagram of one embodiment of a multiplexor circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a block diagram of one embodiment of an 8 to 1 mux 10 is shown. Other embodiments are possible and contemplated. In the embodiment of FIG. 1, the mux 10 is coupled to receive 8 N+1 bit inputs (labeled In0[N:0] through In7[N:0]) and is configured to select one of the 8 inputs as an output (labeled Out[N:0] in FIG. 1). The mux 10 is further coupled to receive selection control signals (labeled Sel[7:0] in FIG. 1), which indicate which of the inputs is to be selected as the output.

In the illustrated embodiment, the select signals received by the mux 10 are a one-hot form of selection. In this form, each of the select signals corresponds to a different input (e.g. Sel[0] may correspond to In0[N:0], Sel[1] may correspond to 1 n[N:0], etc.) If a given select signal is asserted, the corresponding input is selected as the output (e.g. if the select signal Sel[0] is asserted, In0[N:0] is selected as Out[N:0]). Other embodiments may receive an encoded selection signal (e.g. for 8 inputs, three select signals could be used with the eight encodings assigned to respective ones of the inputs).

Generally, the mux 10 may be configured to select any number of bits per input (e.g. N may be any integer greater than or equal to zero). Additionally, while an 8 to 1 mux is shown, other embodiments may have any number of inputs, as desired.

Figure 2:
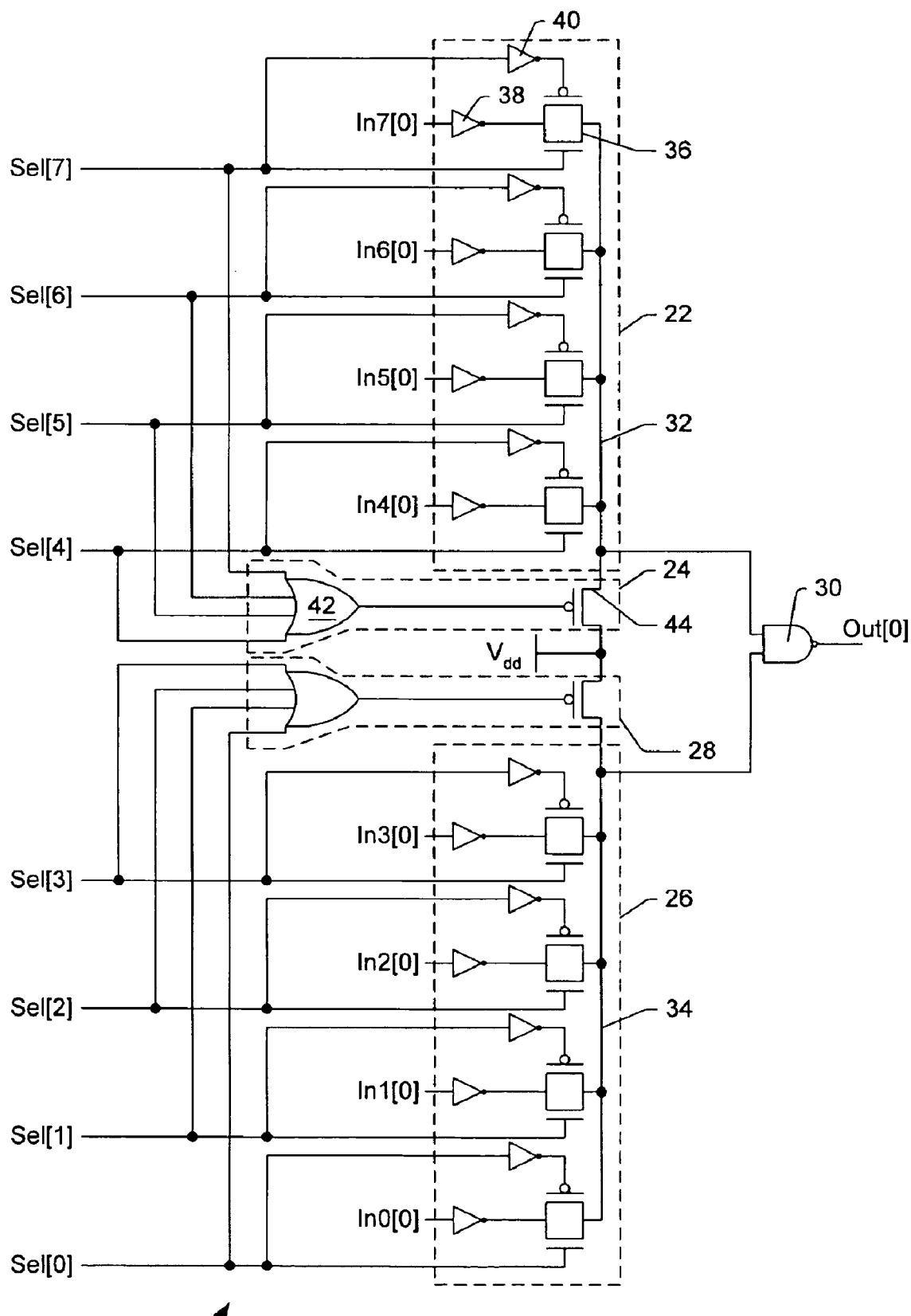
FIG. 2 is a circuit diagram of one embodiment of a portion of the multiplexor circuit shown in FIG. 1.

Turning now to FIG. 2, a circuit diagram of a portion 20 of one embodiment the mux 10 is shown. Other embodiments are possible and contemplated. The portion 20 shown in FIG. 2 includes a first passgate circuit 22, a first default circuit 24, a second passgate circuit 26, a second default circuit 28, and an output circuit 30. The first passgate circuit 22 is coupled to receive bit zero of the inputs In7, In6, In5, and In4 and the corresponding select signals Sel[7:4]. The first default circuit 24 is coupled to receive the select signals Sel[7:4] corresponding to the first passgate circuit 22. Similarly, the second passgate circuit 26 is coupled to receive bit zero of the inputs In3, In2, In1, and In0 and the corresponding select signals Sel[3:0], and the second default circuit 28 is coupled to receive the select signals Sel[3:0] corresponding to the second passgate circuit 26. The first passgate circuit 22 includes a first output node 32, to which the first default circuit 24 is coupled. The second passgate circuit 26 similarly includes a second output node 34, to which the second default circuit 28 is coupled. The output circuit 30 has inputs coupled to the first output node 32 and the second output node 34, and produces bit zero of the output signal (Out[0]). Circuitry similar to portion 20 may be included for each additional bit of the inputs In7–In0, in multibit embodiments.

The mux 10 comprising portions 20 such as those illustrated in FIG. 2 (or FIGS. 3 and 4 below) may operate with a relatively low delay. Specifically, the diffusion capacitance on each output node of a passgate circuit (e.g. the output nodes 32 and 34 in FIG. 2) may be lower than would be the case if passgates for each input signal were coupled to a single output node. Furthermore, the output circuit 30 may be a relatively high speed circuit (e.g. a NAND gate in the embodiment of FIG. 2). The overall circuit may provide a low delay (high speed), wide multiplexor.

The operation of the passgate circuit 22 and the default circuit 24 will be described, with the operation of the passgate circuit 26 and the default circuit 28 being similar for the input signals, select signals, and output node corresponding to the passgate circuit 26 and the default circuit 28 as shown in FIG. 2.

Generally, the passgate circuit 22 is configured to supply a voltage on the output node 32 if one of the select signals Sel[7:4] is asserted. If none of the select signals Sel[7:4] is asserted, the passgate circuit 22 floats the output node 32. In other words, if none of the select signals Sel[7:4] is asserted, the passgate circuit 22 does not actively drive a voltage on the output node 32. If none of the select signals Sel[7:4] is asserted, the default circuit 24 provides a default voltage on the output node 32. The default voltage is a voltage which, as an input to the output circuit 30, allows the voltage from another passgate circuit (e.g. the passgate circuit 26) to control the output of the output circuit 30. For example, in the embodiment of FIG. 2, the output circuit 30 comprises a NAND gate. Thus, the default circuit 24 may output a default voltage representing a logical one. In this manner, the NAND result of the default voltage and the voltage output from the passgate circuit 26 is controlled by the voltage output from the passgate circuit 26.

The passgate circuit 22 includes passgates for each input signal coupled to the passgate circuit 22 (e.g. four passgates in the illustrated embodiment). Each of the passgates is coupled to receive a respective input signal and select signal and is coupled to the output node 32. For example, the passgate 36 is included for the input signal In7[0]. The passgate 36 is coupled to receive a signal corresponding to the input signal In7[0] (in this case an inversion of the input signal In7[0] through an inverter 38). Responsive to an assertion of the select signal Sel[7], the passgate 36 is configured to pass the voltage representing the inversion of the input signal In7[0] to the output node 32. If the select signal Sel[7] is not asserted, the passgate 36 inhibits passage of the voltage to the output node 32.

If the select signal Sel[7] is asserted, then other select signals Sel[6:0] are deasserted for the illustrated embodiment (in which the select signals are one hot). Thus, the default circuit 28 outputs the default voltage. Accordingly, the inversion of the In7[0] signal controls the output Out[0] of the NAND gate comprising the output circuit 30. Particularly, the output Out[0] is equal to the input signal In7[0]. Thus, the mux 10 is non-inverting in the illustrated embodiment. While the select signals are one hot in this embodiment, other embodiments may employ an encoded set of select signals. Such embodiments could include decoder circuitry to decode each of the select signals Sel[7:0] from the encoded value.

The passgate 36 comprises a parallel connection of an N-type Metal-Oxide-Semiconductor (NMOS) transistor and a P-type MOS (PMOS) transistor. The gates of the NMOS and PMOS transistors are coupled to receive signals which activate the transistors if the input signal is to be passed to the output. In the illustrated embodiment, for example, the select signal Sel[7] is defined to be asserted when carrying a logical one (a $V_{dd}$ voltage) and deasserted when carrying a logical zero. Accordingly, the gate terminal of the NMOS transistor is connected to receive the select signal Sel[7] and the gate terminal of the PMOS transistor is connected to receive the inversion of the select signal Sel[7] through an inverter 40.

The default circuit 24 includes an OR gate 42 and a PMOS transistor 44 in the illustrated embodiment. The PMOS transistor 44 is coupled between the $V_{dd}$ voltage source and the output node 32, and has a gate terminal coupled to the output of the OR gate 42. The OR gate 42 is included to OR the select signals Sel[7:4]. If none of the select signals is asserted, the output of the OR gate is a logical zero (a ground voltage), and thus the PMOS transistor 44 is activated and supplies a $V_{dd}$ voltage (a logical one) on the output node 32. If any of the select signals Sel[7:4] is asserted, the output of the OR gate 42 is a logical one (a $V_{dd}$ voltage), and thus the PMOS transistor 44 is not activated. The default circuit 28 may include similar components and be coupled to receive the select signals Sel[3:0], as illustrated in FIG. 2.

It is noted that, in the illustrated embodiment, the mux 10 may not require a default select signal to be asserted to provide a non-floating output. Instead, if none of the select signals to mux 10 is asserted, the default circuits ensure that no nodes are floating.

Figure 3:
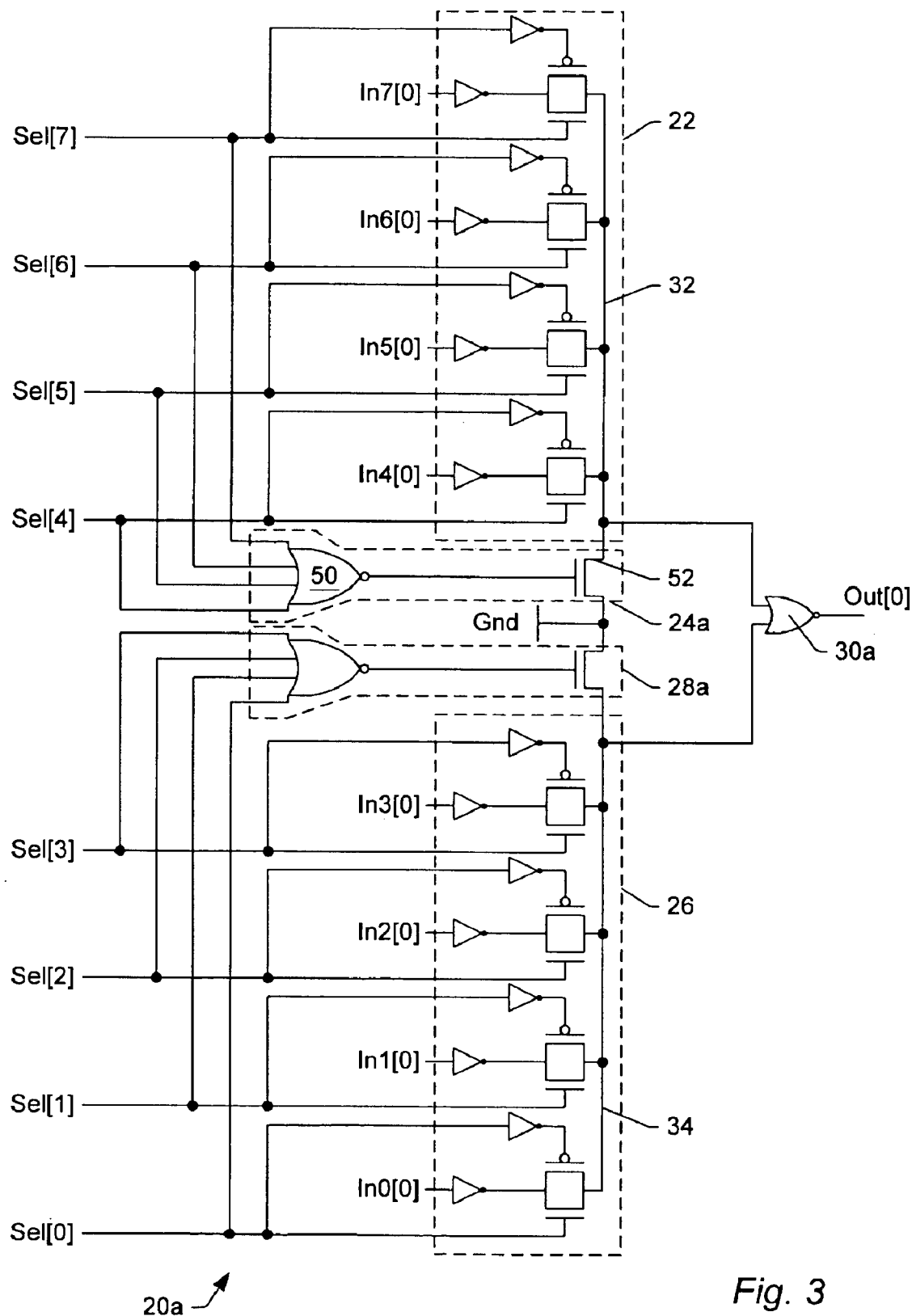
FIG. 3 is a circuit diagram of a second embodiment of a portion of the multiplexor circuit shown in FIG. 1.

Turning next to FIG. 3, a block diagram of a second embodiment of a portion 20a of the mux 10 is shown. Other embodiments are possible and contemplated. In the embodiment of FIG. 3, the portion 20a includes the passgate circuits 22 and 26 as illustrated in FIG. 2. Additionally, the portion 20a includes default circuits 24a and 28a and output circuit 30a. The default circuit 24a is coupled to receive the select signals Sel[7:4] and is coupled to the output node 32. The default circuit 28a is coupled to receive the select signals Sel[3:0] and is coupled to the output node 34. The output circuit 30a has inputs coupled to the output nodes 32 and 34.

Generally, the passgate circuits 22 and 26 may operate similar to the description of FIG. 2 above. However, the default circuits 24a and 28a may supply a ground voltage on the respective output nodes 32 and 34 if none of the select signals corresponding to the respective passgate circuit 22 and 26 is asserted. In the embodiment of FIG. 3, the default circuit 24a includes a NOR gate 50 and an NMOS transistor 52. The NMOS transistor 52 is coupled between ground and the output node 32, and has a gate terminal coupled to the output of the NOR gate 50. The NOR gate 50 is coupled to receive the select signals Sel[7:4] corresponding to the passgate circuit 22. If none of the select signals Sel[7:4] are asserted, the output of the NOR gate 50 is a logical one ($V_{dd}$), and thus transistor 52 is activated and supplies the ground voltage (a logical zero) on the output node 32. If any of the select signals Sel[7:4] is asserted, then the output of the NOR gate 50 is a logical zero (ground), and the transistor 52 is not activated. The default circuit 28a may include similar components and be coupled to receive the select signals Sel[3:0] as illustrated in FIG. 3.

Since the default circuits 24a and 28a provide default voltages representing a logical zero in this embodiment, the output circuit 30a may comprise a NOR gate in this embodiment. The logical zero from the default circuit 24a or 28a thus allows the voltage on the other output node 34 or 32, respectively, to control the output of the output circuit 30a.

It is noted that, while the select signals are defined to be asserted at a logical one ($V_{dd}$ voltage) and deasserted at a logical zero (ground voltage), other embodiments may use the opposite definition (i.e. the selection signals may be defined to be asserted at a logical zero and deasserted at a logical one). In such an embodiment, the inverter 40 may be coupled between the select signal and the gate terminal of the NMOS transistor of the passgate 36 instead of between the select signal and the gate terminal of the PMOS transistor of the passgate 36, as illustrated in FIG. 2. Other inverters similar to the inverter 40 may similarly be changed (both in FIG. 2 and in FIG. 3). Furthermore, the OR gate 42 (and similar OR gates in other default circuits in FIG. 2) may be changed to a NOR gate and the NOR gate 50 may be changed to an OR gate (and similar NOR gates in other default circuits in FIG. 3) if the asserted/deasserted definitions of the select signals are changed. Thus, generally the logic gates in various embodiments of the default circuits may perform an OR function (which may include OR or NOR, depending on the embodiment). Generally, a signal may be defined to be asserted at a first voltage indicative of a first logical value and to be deasserted at a second voltage indicative of a second logical value. The logical value and corresponding voltage may be varied from embodiment to embodiment. In Complementary MOS (CMOS) circuitry such as that shown in FIGS. 2 and 3, a logical zero is represented by a ground voltage and a logical one is represented by a $V_{dd}$ voltage. Other embodiments may reverse the voltage definitions or may apply other voltage definitions, as desired.

It is noted that other embodiments of mux 10 may be inverting muxes. In such an embodiment, either the inverter 38 (and other similar inverters in FIG. 2 or 3) may be deleted, or the NAND gate comprising the output circuit 30 may be changed to an AND gate in FIG. 2 and the NOR gate comprising the output circuit 30a may be changed to an OR gate. Furthermore, non-inverting embodiments of the mux 10 are contemplated in which both the inverter 38 is deleted and the NAND gate comprising the output circuit 30 is changed to AND gate (or the NOR gate comprising the output circuit 30a is changed to an OR gate). Generally, the output circuit 30 may perform an AND function on its inputs to produce the output (which may include AND or NAND, depending on the embodiment), and the output circuit 30a may perform an OR function on its inputs to produce the output.

It is noted that, in multibit mux embodiments, the logic gate 42 or 50 may be shared among transistors 44 or 52 corresponding to multiple bits (i.e. one logic gate 42 or 50 may be supplied per X bits, where X is an integer greater than one, and the output of the logic gate may be coupled to multiple gate terminals of transistors similar to transistors 44 or 52).

Figure 4:
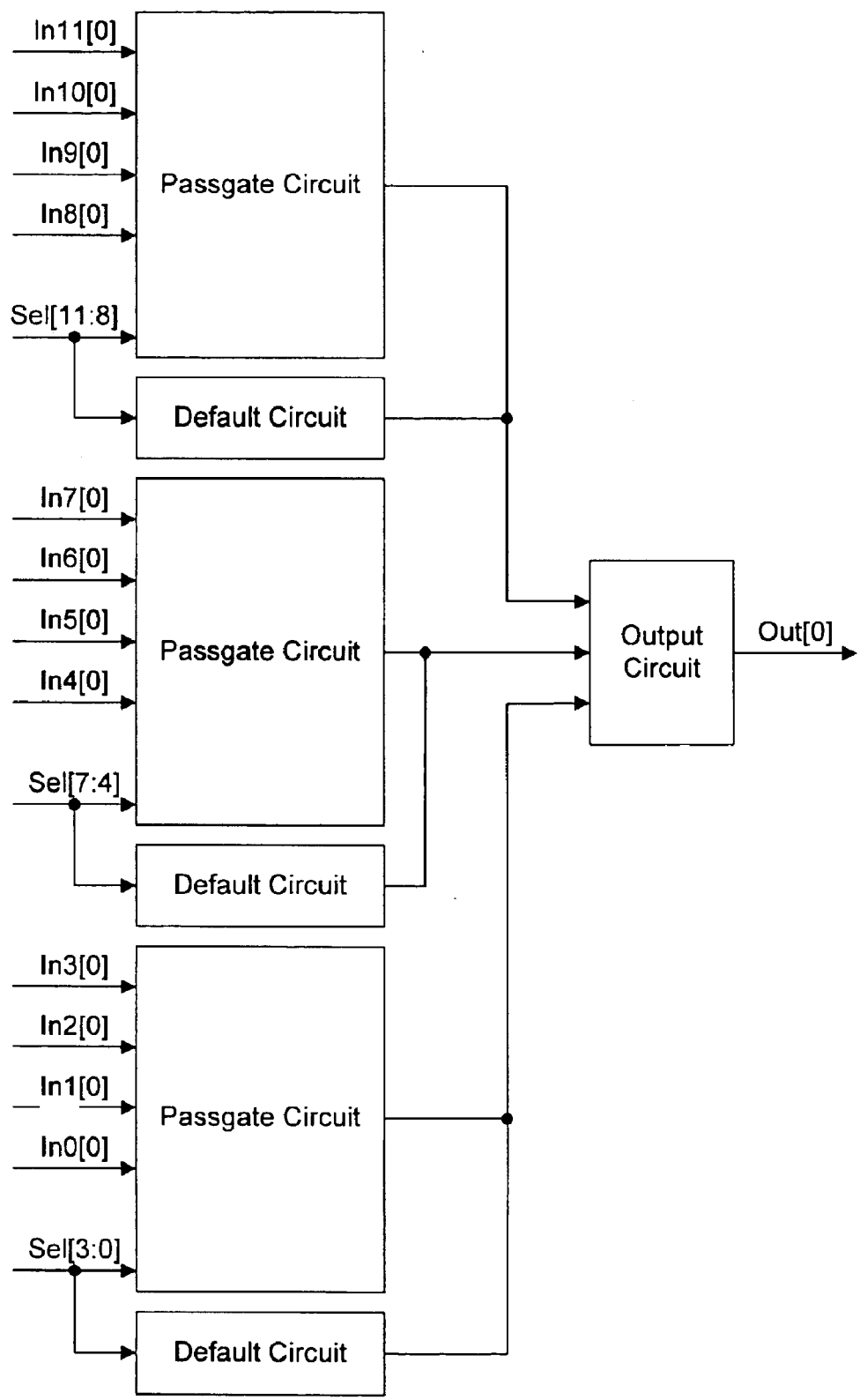
FIG. 4 is a block diagram of a third embodiment of a portion of a multiplexor circuit.

While the embodiment of FIGS. 2 and 3 illustrates two passgate circuits 22 and 26 and corresponding default circuits 24 and 28 (or 24a and 28a), other embodiments may include more or fewer sets of passgate circuits 22 and 26 and default circuits 24 and 28 (or 24a and 28a). For example, FIG. 4 illustrates an embodiment of a portion 20c of the mux 10 with three passgate circuits, each coupled to receive four input signals and corresponding select signals to perform a 12 to one mux. A corresponding default circuit is included for each passgate circuit, coupled to that passgate circuit's output node and coupled to receive the same select signals as that passgate circuit. The output circuit in the embodiment of FIG. 4 may include three inputs, one for each passgate circuit and corresponding default circuit. The output circuit may be a three input NAND (or AND) or three input NOR (or OR) depending on the embodiment of the default circuit used. Furthermore, additional sets of passgate circuits and default circuits may be used (and an output circuit including one or more combinatorial logic gates may be used to generate the output signal).

Furthermore, while the illustrated embodiments include 4 input signals and corresponding select signals per passgate circuit, other embodiments may include more or fewer signals per passgate circuit, as desired. Unequal numbers of signals may be included in passgate circuits forming a particular embodiment of mux 10, as desired. For example, a 7 to 1 mux may include a four input passgate circuit and a three input passgate circuit (with corresponding default circuits and a two input NAND, NOR, etc. logic gate in the output circuit). A 6 to 1 mux may include 2 three input passgate circuits (with corresponding default circuits and a two input NAND, NOR, etc. logic gate in the output circuit). A 20 to 1 mux may include 4 five input passgate circuits (with corresponding default circuits and a four input NAND, NOR, etc. logic gate or gates in the output circuit). Alternatively, a 20 to 1 mux may include 5 four input passgate circuits (with corresponding default circuits and logic gates performing a five input NAND, NOR, etc. function in the output circuit). Any combination of passgate circuits, default circuits, and output circuits may be used.

Figure 5:
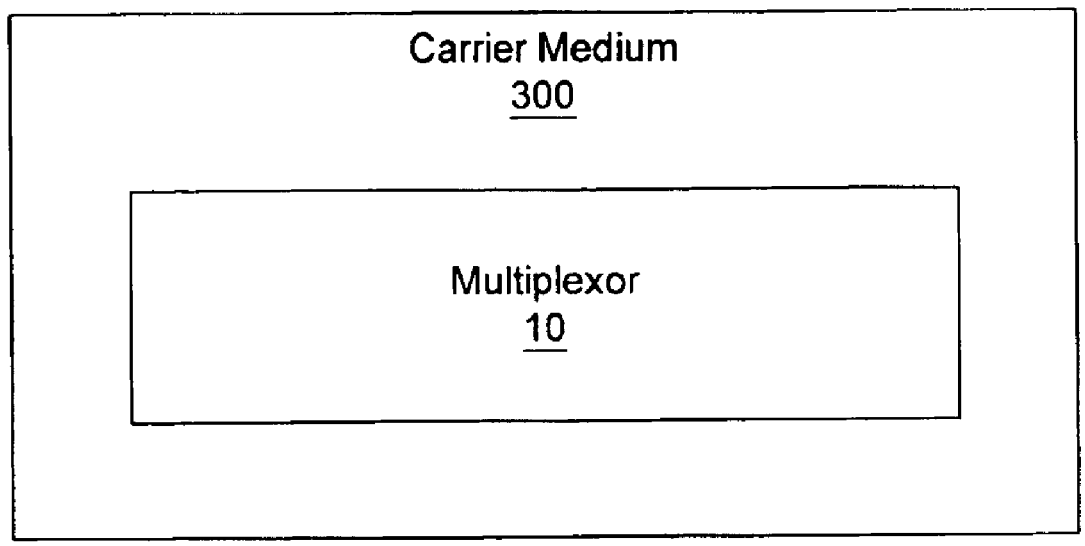
FIG. 5 is a block diagram of a carrier medium.

Turning next to FIG. 5, a block diagram of a carrier medium 300 including a database representative of the mux 10 is shown. Generally speaking, a carrier medium may include storage media such as magnetic or optical media, e.g., disk or CD-ROM, volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

Generally, the database of the mux 10 carried on the carrier medium 300 may be a database which can be read by a program and used, directly or indirectly, to fabricate the hardware comprising the mux 10. For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the mux 10. The netlist may then be placed and routed to produce a data set describing geometric shapes to be applied to masks. The masks may then be used in various semiconductor fabrication steps to produce a semiconductor circuit or circuits corresponding to the mux 10. Alternatively, the database on the carrier medium 300 may be the netlist (with or without the synthesis library) or the data set, as desired.

While the carrier medium 300 carries a representation of the mux 10, other embodiments may carry a representation of any portion of the mux 10, as desired, including any set passgate circuits, default circuits, output circuits, or a portion thereof, etc.

Numerous variations and modifications will become apparent to those skilled in the art once the above disclosure is fully appreciated. It is intended that the following claims be interpreted to embrace all such variations and modifications.

What is claimed is:

1. A multiplexer circuit comprising:
   a first passgate circuit coupled to receive a first set of four input bits and a first set of four corresponding select signals, the first set of select signals to select one of the first set of four input bits to be passed through a corresponding passgate and onto a first node;
   a first default circuit also coupled to receive the first set of four select signals as inputs to a first OR gate and output of the first OR gate coupled to a gate of a first P-type transistor, which is activated to couple a default supply voltage directly onto the first node, if the first set of select signals select none of the first set of input bits to be passed through to the first node;
   a second passgate circuit coupled to receive a second set of four input bits and a second set of four corresponding select signals, the second set of select signals to select one of the second set of four input bits to be passed through a corresponding passgate and onto a second node;
   a second default circuit also coupled to receive the second set of four select signals as inputs to a second OR gate and output of the second OR gate coupled to a gate of a second P-type transistor, which is activated to couple the default supply voltage directly onto the second node, if the second set of select signals select none of the second set of input bits to be passed through to the second node; and
   a NAND gate coupled directly to the first and second nodes without a use of a buffer between the first node and a first input terminal of the NAND gate and between the second node and a second input terminal of the NAND gate, the NAND gate to receive either one of the first set of inputs bits or one of the second set of input bits for output from the NAND gate, in which the default supply voltage is coupled to the NAND gate from other of the first or second node not having an input bit selected for output from the NAND gate, and in which direct coupling of the first and second nodes to the NAND gate generates the output from the NAND gate with reduced time delay in response to an eight bit width input to the multiplexer circuit.

2. The multiplexer circuit of claim 1 wherein the default supply voltage is Vdd.

* * * * *